US 7,433,050 B2

(12) United States Patent
Sakamoto (10) Patent No.: US 7,433,050 B2
(45) Date of Patent: Oct. 7, 2008

(54) EXPOSURE APPARATUS AND EXPOSURE METHOD

(75) Inventor: Hideaki Sakamoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 91 days.

(21) Appl. No.: 11/542,253

(22) Filed: Oct. 4, 2006

(65) Prior Publication Data

US 2007/0097367 A1 May 3, 2007

Related U.S. Application Data

(60) Provisional application No. 60/728,769, filed on Oct. 21, 2005.

(30) Foreign Application Priority Data

Oct. 5, 2005 (JP) ............................. 2005-292186
Oct. 4, 2006 (JP) ............................. 2006-273493

(51) Int. Cl.
*G01B 11/02* (2006.01)
*G03B 27/42* (2006.01)
(52) U.S. Cl. ........................................ 356/500; 355/53
(58) Field of Classification Search ................. 356/496, 356/498, 500, 508; 355/53
See application file for complete search history.

(56) References Cited

U.S. PATENT DOCUMENTS

| 6,246,204 B1 | 6/2001 | Ebihara et al. |
| 6,774,981 B1 * | 8/2004 | Watson et al. ................. 355/53 |
| 6,940,582 B1 | 9/2005 | Tanaka |
| 2005/0117224 A1 | 6/2005 | Shafer et al. |
| 2005/0248856 A1 | 11/2005 | Omura et al. |
| 2006/0121364 A1 | 6/2006 | Omura |
| 2007/0030462 A1 | 2/2007 | Yuan et al. |

FOREIGN PATENT DOCUMENTS

| JP | A 1-253603 | 10/1989 |
| JP | A 2006-140366 | 6/2006 |
| WO | WO 99/49504 | 9/1999 |
| WO | WO 01/22480 A1 | 3/2001 |
| WO | WO 2004/019128 A2 | 3/2004 |
| WO | WO 2004/107011 | 12/2004 |
| WO | WO 2005/059617 A2 | 6/2005 |
| WO | WO 2006/038952 A2 | 4/2006 |

* cited by examiner

*Primary Examiner*—Michael A Lyons
(74) *Attorney, Agent, or Firm*—Oliff & Berridge, PLC (57) ABSTRACT

Disclosed is an exposing apparatus which projects an image of a pattern by a projection optical system, comprising a measuring unit having a sensor which measures a positional relationship between the projection optical system and a member which is positioned in relation to the projection optical system, and a first support device which has a first soft structure and which supports the measuring unit in a hanging manner separately from the projection optical system.

19 Claims, 6 Drawing Sheets

EXPOSURE APPARATUS AND EXPOSURE METHOD

BACKGROUND OF THE INVENTION

1. Field of the Invention

The present invention relates to an exposing apparatus which projects an image of a predetermined pattern by a projection optical system, and an exposing method using this exposing apparatus. In a lithography step for producing various devices such as a semiconductor device and a liquid crystal display, the invention is suitably used for transferring a mask pattern onto a substrate.

2. Description of Related Art

In a lithography step which is one of producing steps of a semiconductor device, an exposing apparatus such as a full field exposing type projection exposing apparatus like a stepper, and a scanning exposing type projection exposing apparatus like a scanning stepper is used for exposing and transferring a pattern formed on a reticle (or photomask) as a mask onto a wafer (such as a glass plate) as a substrate on which a photoresist is applied.

In such exposing apparatuses, rigidity of a stage which positions or moves a reticle and a wafer, rigidity of a support mechanism of the stage, and rigidity of a mechanism portion of a support mechanism of a projection optical system exert a great influence on performance of apparatus such as vibration isolating performance and exposure precision (superposing precision), the weight of the mechanism portion and producing costs of the exposing apparatus. Generally, an exposing apparatus having a mechanism portion of high rigidity has high apparatus performance, but there is a tendency to increase the weight of the mechanism portion and to increase the producing cost. Hence, to reduce the weight of the entire mechanism portion while maintaining high rigidity of necessary portions of the apparatus, there is proposed an exposing apparatus which independently supports bases such as a reticle stage and a wafer stage by a parallel link mechanism having a plurality of rods which can extend and contract (e.g., see an International Patent Application Publication Laid-open No. 01/022480).

Lately, to enhance a resolution, there is also developed an immersion type exposing apparatus which supplies liquid between a projection optical system and a wafer (see an International Patent Application Publication Laid-open No. 99/49504).

According to the conventional method using the parallel link mechanism having the plurality of rods which can extend and contract, it is possible to reduce the weight of the mechanism portion and to enhance the control precision of a moving portion of a stage, but there is a fear that the structure of the mechanism portion becomes complicated, and the positioning of the stage and control at the time of acceleration and deceleration become also complicated.

In the exposing apparatus, a sensor for measuring a positional relationship between the projection optical system and the wafer stage is used. In the conventional technique, the sensor is integrally supported together with the projection optical system. Even if the projection optical system and the sensor are integrally supported using a support member having high rigidity, however, there is a fear that the positional relationship between the projection optical system and the sensor is varied beyond the permissible range due to influence of vibration from a floor or irradiation heat of illumination light for exposure. Further, according to the structure in which the projection optical system and the sensor are integrally supported, there is a problem that the adjusting time required until the positional relationship therebetween is set to a predetermined target positional relationship is increased when the exposing apparatus is assembled and adjusted, and time required for maintenance of the projection optical system and the sensor is also increased.

In the conventional immersion type exposing apparatus, since a portion of an device which supplies liquid between the projection optical system and a wafer is integrally supported together with the projection optical system, there is a fear that vibration generated in the liquid supply device is transmitted to the projection optical system, and exposure precision is deteriorated.

SUMMARY OF THE INVENTION

In view of the above circumstances, it is a first object of the present invention to provide an exposing technique capable of supporting, by means of a relatively simple and light-weighted mechanism, a sensor which measures the positional relationship between the projection optical system and a predetermined member.

It is a second object of the invention to provide an exposing technique capable of supporting, by means of a relatively simple and light-weighted mechanism, a portion of a device which supplies liquid between the projection optical system and an object to be exposed in a state in which influence of vibration on the projection optical system is reduced.

According to a first aspect of the present invention, there is provided an exposing apparatus which projects an image of a pattern by a projection optical system (PL), comprising a measuring unit (15) having a sensor (12) which measures a positional relationship between the projection optical system (PL) and a member (WST) which is positioned in relation to the projection optical system (PL), and a first support device (38A, 38B, 38C, 39A) which has a first soft structure (38A) and which supports the measuring unit (15) in a hanging manner separately from the projection optical system (PL).

According to the first exposing apparatus of the invention, the first soft structure can be light-weighted and inexpensive as compared with a rigid structure. With this soft structure, it is possible to obtain preferable characteristics that vibration is shut off and thermal displacement is avoided. Therefore, it is possible to support the sensor with a relatively simple and light-weighted mechanism in a state in which influence of vibration on the projection optical system is reduced.

According to a second aspect of the invention, there is provided an exposing apparatus which projects an image of a pattern on an object (W) by a projection optical system (PL), comprising a liquid supply device (61, 62, 63) which supplies liquid between the projection optical system (PL) and the object, and a first support device (38A, 38B, 38C, 39A) which has a first soft structure (38A) and which supports at least a portion (63) of the liquid supply device in a hanging manner separately from the projection optical system (PL).

Since the second exposing apparatus of the invention also uses the first support device, it is possible to support at least a portion of the liquid supply device by the relatively simple light-weighted mechanism in a state in which the influence of vibration on the projection optical system is reduced.

The first and second exposing apparatuses of the invention can further comprise a second support device (35A, 35B, 35C, 36A) which has a second soft structure (35A) and which supports the projection optical system in a hanging manner. With this, the vibration isolation performance of the projection optical system is enhanced.

According to a third aspect of the invention, there is provided an exposing method which transfers an image of the pattern using the exposing apparatus of the invention.

To make it easy to understand the invention, the invention is explained with reference to the drawings showing an embodiment, but the invention is not limited to the embodiment of course. The structure of the embodiment corresponding to the drawings can appropriately be modified, and at least a portion thereof may be replaced by another constituent element.

According to the first exposing apparatus of the invention, it is possible to support, by means of a relatively simple and light-weighted mechanism a sensor which measures the positional relationship between the projection optical system and a predetermined member.

According to the second exposing apparatus of the invention, it is possible to support, by means of a relatively simple and light-weighted mechanism, a portion of a device which supplies liquid between the projection optical system and an object to be exposed in a state in which influence of vibration on the projection optical system is reduced.

According to the invention, since the measuring section and the projection optical system are supported in the hanging manner by different hanging members, the measuring section and the projection optical system are thermally separated from each other. Even if a heat source is disposed in the measuring section, the heat from the heat source is not transmitted to the barrel of the projection optical system. Therefore, a distortion is not generated in the barrel by heat and thus, unnecessary stress is not applied to the optical element disposed in the barrel. Thus, it is possible to suppress the deterioration of image forming ability of the projection optical system.

According to the invention, the nozzle which can be a vibration source is fixed to the measuring section, and the measuring section and the projection optical system are supported in the hanging manner by different hanging members. Since vibration is not transmitted to the barrel of the projection optical system, the exposing apparatus of the invention can precisely transfer a mask pattern onto a substrate.

BRIEF DESCRIPTION OF THE DRAWINGS

These and other objects, features as well as advantages of the present invention will become clear by the accompanying drawings and the following detailed description, wherein.

DESCRIPTION OF PREFERRED EMBODIMENTS

A preferred first embodiment of the present invention will be explained with reference to FIGS. 1 to 5.

Figure 1:
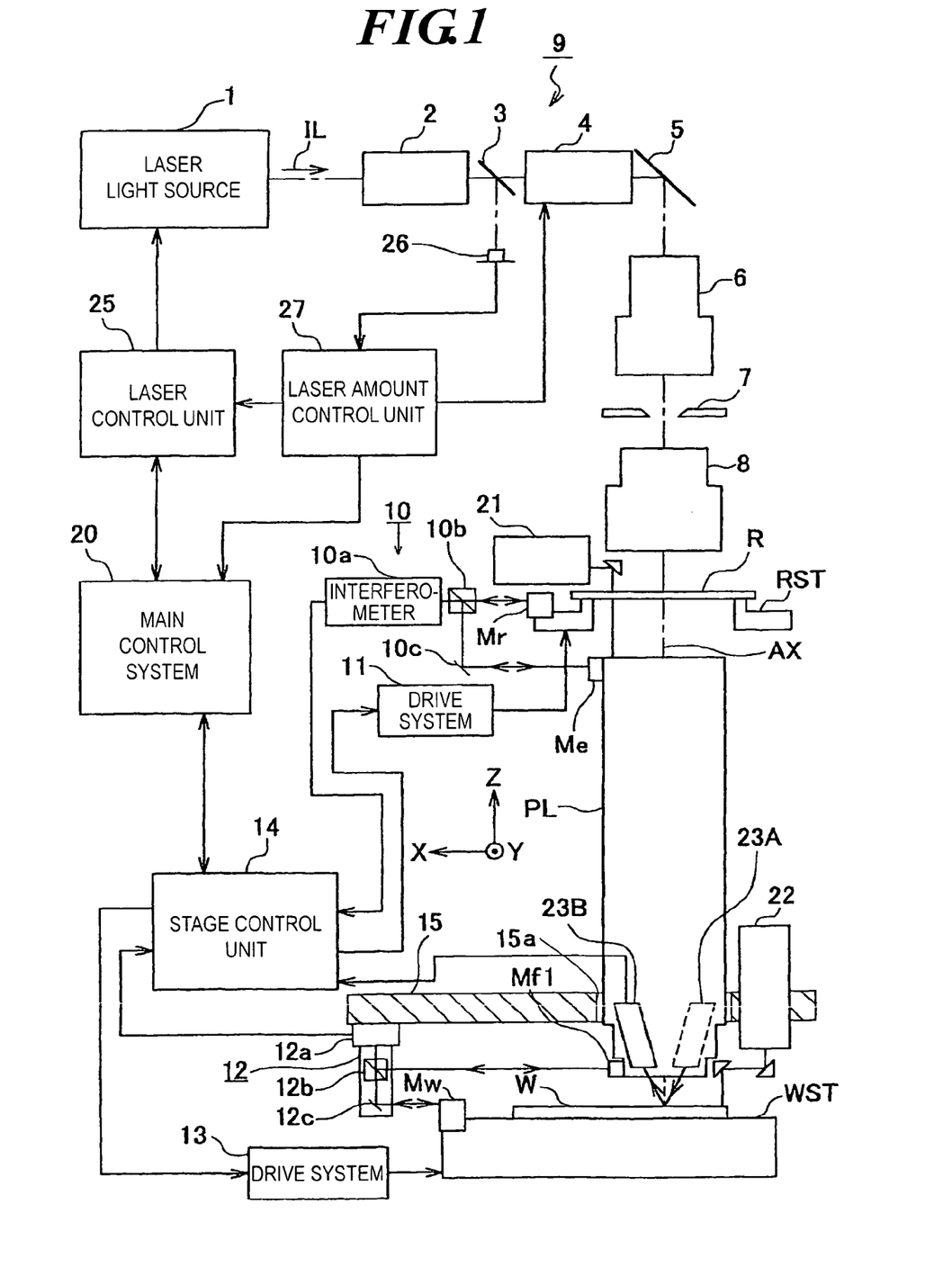
FIG. 1 is a schematic block diagram of a projection exposing apparatus according to a first embodiment of the present invention.

FIG. 1 is a block diagram of function units constituting a projection exposing apparatus as an exposing apparatus of the embodiment. In FIG. 1, a chamber for accommodating the projection exposing apparatus is omitted. In FIG. 1, a laser light source 1 including a KrF excimer laser (wavelength: 248 nm) or an ArF excimer laser (wavelength: 193 nm) is used as an exposing light source. It is also possible to use, as the exposing light source, an F2 laser (wavelength: 157 nm), a light source which outputs harmonic laser from a solid-state laser light source (YAG or a semiconductor laser), and a mercury discharge lamp.

A reticle blind mechanism 7 is irradiated with exposing illumination light IL as exposure beam (exposure light) from a laser light source 1 through a homogenizing optical system 2 comprising a lens system and a fly-eye lens system, a beam splitter 3, a variable beam attenuator 4 for adjusting light quantity, a mirror 5 and a relay lens system 6 with uniform illumination distribution. The projection exposing apparatus of this embodiment is of a scanning exposing type, and the reticle blind mechanism 7 includes a stationary blind which defines a slit-like illumination region, and a moving blind which opens and closes the illumination region at the time of scanning and exposing operations. The illumination light IL which passed the reticle blind mechanism 7 is applied to the illumination region on a reticle R as a mask through an image forming lens system 8. An illumination optical system 9 comprises the homogenizing optical system 2, the beam splitter 3, the variable beam attenuator 4, the mirror 5, the relay lens system 6, the relay lens system 6 and the image forming lens system 8. FIG. 1 is the function block diagram, and the number and disposition of mirrors for bending an optical path in the illumination optical system 9 are different from actual number and disposition.

An image of a portion of a circuit pattern formed on the reticle R which is irradiated by the illumination light is formed and projected on a wafer W to which a resist is applied as an object (sensitive substrate or photosensitive body) through a projection optical system PL. Both sides of the projection optical system PL are telecentric, and its projection magnification is reducing magnification (e.g., ¼). A Z-axis is parallel to an optical axis AX of the projection optical system PL, an X-axis is parallel to a paper sheet of FIG. 1 in a plane which is perpendicular to the Z-axis, and a Y-axis is perpendicular to the paper sheet of FIG. 1. In the embodiment, a direction (Z-direction) running along the Z-axis is the vertical direction. A direction running along the Y-axis is a scanning direction of the reticle R and the wafer W at the time of scanning and exposing operations. The illumination region on the reticle R has a shape which is long in a direction (X-direction) running along the X-axis which is non-scanning direction.

Figure 2:
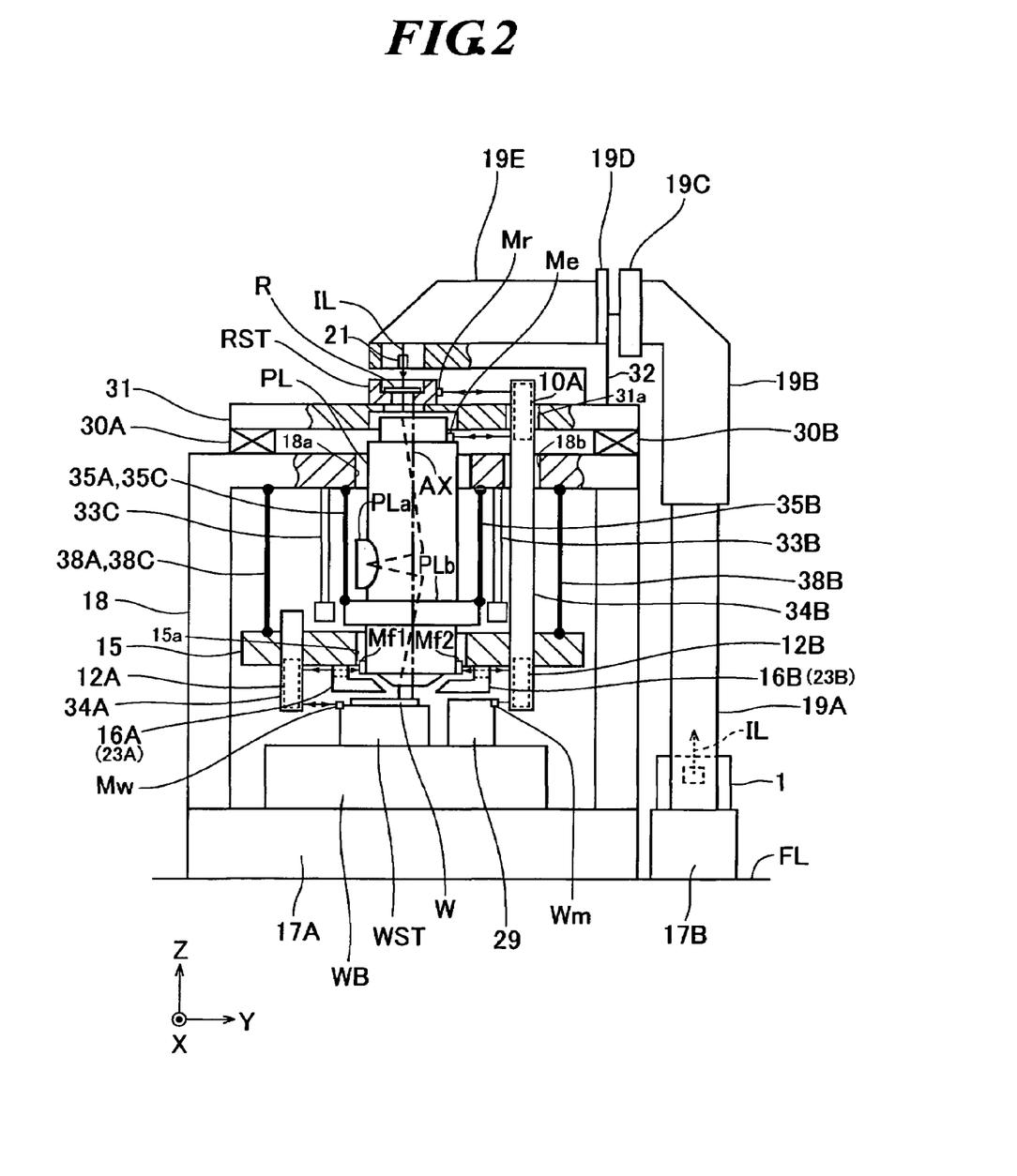
FIG. 2 is a partially cut away schematic diagram showing a structure of a mechanism portion of the projection exposing apparatus of the first embodiment.

FIG. 2 is a partially cut away schematic diagram of a mechanism portion of the projection exposing apparatus shown in FIG. 1 as viewed from a −X-direction. As shown in FIG. 2, the projection optical system PL of the embodiment is a catadioptric projection optical system in which a concave mirror is accommodated in a convex portion PLa of a barrel, and an image is projected such that the image is positionally correct in the Y-direction, and is inverted in the X-direction. An International Patent Application Publication Laid-open No. 2004/019128 discloses a catadioptric projection optical system, and disclosure of this brochure is incorporated in this specification by way of citation. This catadioptric projection optical system can be used as the projection optical system PL. As the projection optical system PL, it is also possible to use catadioptric projection optical systems disclosed in an International Patent Application Publication Laid-open No. 2004/107011, an International Patent Application Publication Laid-open No. 2005/59617, and a U.S. Patent Publication No. 2005/0117224. Disclosures of these publications are also incorporated in this specification by reference. A refractive projection optical system can also be used as the projection optical system PL.

Figure 3:
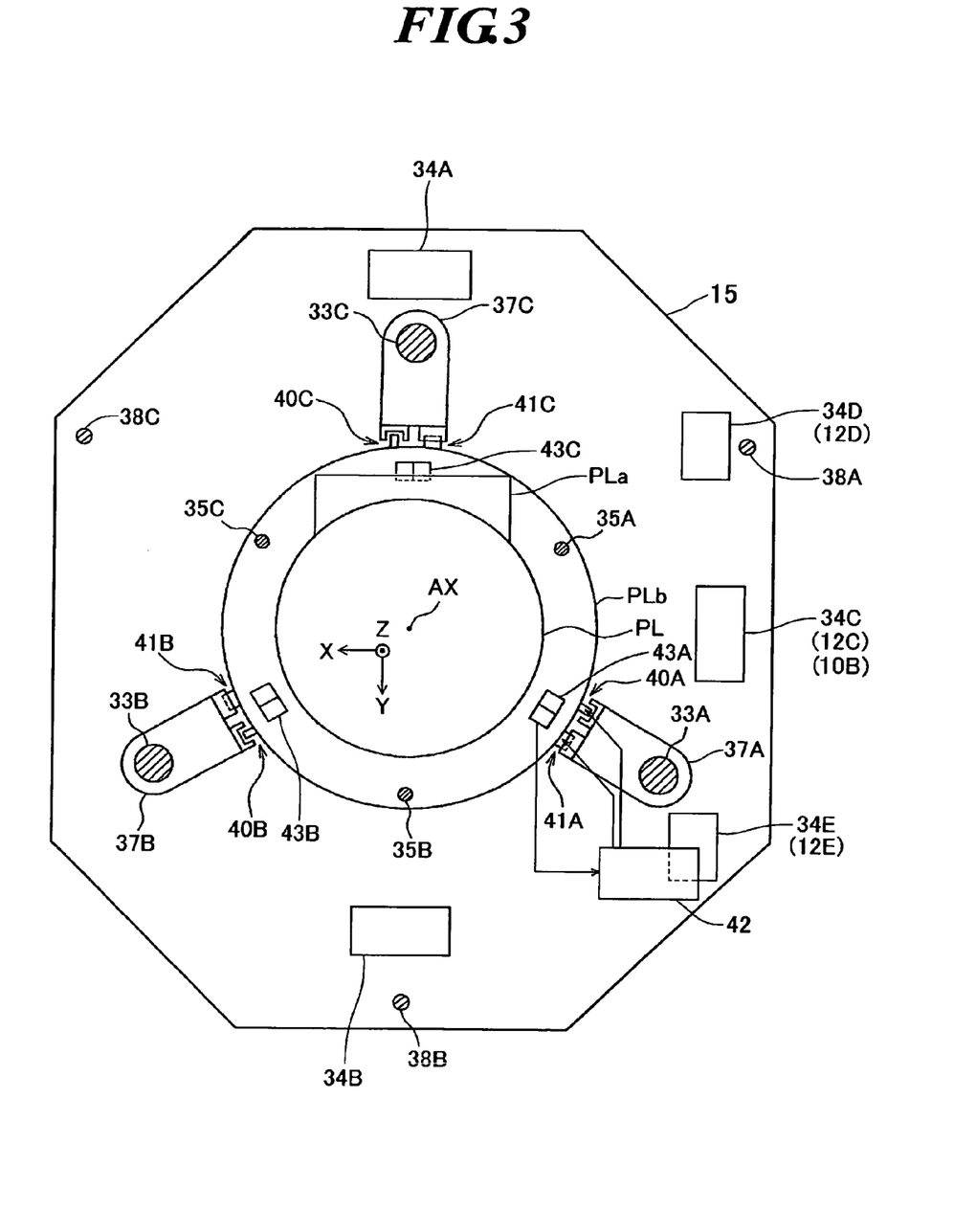
FIG. 3 is a partially cut away plan view showing a measuring frame 15 and a projection optical system PL shown in FIG. 2.

Referring back to FIG. 1, the projection optical system PL is disposed in a central opening 15a of each of measuring frames 15 (measuring unit) which is a flat plate member in a non-contact state. Various sensors are fixed to the measuring frames 15 (details will be described later). An outer shape of the measuring frame 15 is of polygonal shape formed around the projection optical system PL as shown in FIG. 3 (plan view), but other shapes such as a circular shape may also be employed.

In FIG. 1, the reticle R is disposed on the side of a surface of an object of the projection optical system PL. The reticle R is held by vacuum aspiration or the like. A reticle stage RST moves in the Y-direction (scanning direction) through an air bearing on a reticle base 31 (see FIG. 2) at a constant speed. The reticle stage RST can adjust positions in the X-direction and Y-direction, and a rotation angle ωR around the Z-axis. A coordinate position (positions in the X-direction and Y-direction, and the rotation angle ωR) of the reticle stage RST with respect to the projection optical system PL is successively measured by a moving mirror Mr fixed to the reticle stage RST, a reference mirror Me fixed to an upper side surface of the projection optical system PL, and a laser interferometer 10 which is opposed to the moving mirror Mr and the reference mirror Me. The laser interferometer 10 includes a laser interferometer main body 10a, a beam splitter 10b which divides laser beam into the moving mirror Mr and the reference mirror Me, and a mirror 10c which supplies the laser beam to the reference mirror Me.

The laser interferometer 10 includes a laser interferometer main body 10a (see FIG. 2) which measures Y coordinate of the reticle stage RST which is actually separated at two locations separated away from each other in the X-direction, and a laser interferometer 10B (see FIG. 3) which measures X coordinate of the reticle stage RST. The laser interferometers 10A and 10B are fixed to upper ends of a sensor columns 34B (see FIG. 2) and 34C (see FIG. 3) fixed to the measuring frames 15. In FIG. 1, the reticle stage RST is moved by a drive system 11 comprising a linear motor and a micromotion actuator. Measurement information of the laser interferometer 10 is supplied to a stage control unit 14, and the stage control unit 14 controls motion of the drive system 11 based on the measurement information and based on control information (input information) from a main control system 20 comprising a computer which controls motions of the entire apparatus in a centralization manner.

In FIG. 1, a wafer W disposed on the side of an image surface of the projection optical system PL is adsorbed and held on a wafer stage WST through a wafer holder (not shown). The wafer stage WST is placed on a wafer base WB is placed on a wafer base WB (see FIG. 2) through an air bearing such that the wafer stage WST can move at least in the Y-direction at a constant speed at the time of scanning and exposing operations, and the wafer stage WST can step and move in the X-direction and Y-direction. Coordinate position (positions in the X-direction and Y-direction, and rotation angle ?W around the Z-axis) of the wafer stage WST with respect to the projection optical system PL is successively measured by a reference mirror Mf1 fixed to a lower portion of the projection optical system PL, a moving mirror Mw fixed to the wafer stage WST, and a laser interferometer 12 disposed opposed to the reference mirror Mf1 and the moving mirror Mw. Like the laser interferometer 10, the laser interferometer 12 also includes an interferometer main body 12a, a beam splitter 12b and a mirror 12c. The laser interferometer 12 also includes a laser interferometer 12A (see FIG. 2) which measures Y coordinate of the wafer stage WST, a laser interferometer 12C (see FIG. 3) which measures X-direction of the wafer stage WST during exposure of the wafer W at two locations separated away from each other in the Y-direction, and a laser interferometer 12D (see FIG. 3) which measures X-direction of the wafer stage WST during exchange of wafers. The laser interferometers 12A, 12C and 12D are respectively fixed to lower portions of sensor column 34A (see FIG. 2), 34C and 34D (see FIG. 3) fixed to the measuring frames 15.

As shown in FIG. 2, a measuring stage 29 is formed with a plurality of alignment reference marks independently from the wafer stage WST, and the measuring stage 29 is placed on the wafer base WB through an air bearing such that the measuring stage 29 can be driven by a drive mechanism (not shown) in the X-direction and Y-direction. The laser interferometer 12 shown in FIG. 1 also includes laser interferometers 12B and 12E (see FIG. 3) which measure Y coordinate and X coordinate of the measuring stage 29 by measuring a position of a moving mirror Mm of a side surface of the measuring stage 29 with respect to a reference mirror Mf2 of a side surface of the projection optical system PL. When the measuring stage 29 is located below the projection optical system PL, the X coordinate of the measuring stage 29 is measured by the laser interferometer 12C shown in FIG. 3. The laser interferometers 12B and 12E are fixed to lower portions of the sensor columns 34B (see FIG. 2) and 34E (see FIG. 3) fixed to the measuring frames 15. The laser interferometer 12 shown in FIG. 1 also includes a laser interferometer which measures rotation angles of the wafer stage WST around the X-axis and Y-axis. The laser interferometers 10 and 12 can be regarded as sensors which measure the positional relationship between the projection optical system PL, the wafer stage WST as a predetermined member, the reticle stage RST and the measuring stage 29 shown in FIG. 2.

The wafer stage WST and the measuring stage 29 are moved by a drive system 13 shown in FIG. 1 which comprises an actuator such as a linear motor and a voice coil motor (VCM). The measurement information of the laser interferometer 12 is supplied to the stage control unit 14, and the stage control unit 14 controls motion of the drive system 13 based on the measurement information and the control information (input information) from the main control system 20.

In FIG. 1, the wafer stage WST is provided with a Z levelling mechanism which controls a position (focus position) of the wafer W in the Z-direction, and an inclination angles around the X-axis and Y-axis. Diagonal incident type multi-point auto-focus sensors (23A and 23B) are fixed to the measuring frames 15. The auto-focus sensors 23A and 23B include a projection optical system 23A which projects a slit image on a plurality of measuring points on a surface of the wafer W is fixed to the measuring frames 15, and a photoreceiving optical system 23B which receives light reflected from a surface of the projection optical system 23A, which detects information of a lateral deviation amount of a slit image which is again formed, and which supplies the same to the stage control unit 14. As one example, as shown in FIG. 2, the projection optical system 23A and the projection optical system 23B are respectively fixed to a first support section 16A and a second support section 16B which are fixed to bottom surfaces of measuring frames 15 such that the projection optical system PL is sandwiched in the Y-direction. The auto-focus sensors (23A, 23B) can be regarded as sensors which measure the positional relationship between the projection optical system PL and a wafer W as a predetermined member. Detailed structure of the auto-focus sensor is disclosed in Japanese Patent Application Publication Laid-open No. H1-253603. The disclosure of this publication is also incorporated in this specification by reference.

The stage control unit 14 calculates a defocus amount from an image surface of the projection optical system PL in a plurality of measuring points using information of the lateral deviation amount of the slit image from the auto-focus sensors (23A and 23B). At the time of exposing operation, the stage control unit 14 drives the Z levelling mechanism in the wafer stage WST by an auto-focus manner so that the defocus amount is in a predetermined control precision range.

The stage control unit 14 includes a control circuit on the side of a reticle which controls the drive system 11 optimally based on the measurement information by the laser interferometer 10. The stage control unit 14 also includes a control circuit on the side of a wafer which controls the drive system 13 optimally based on the measurement information by the laser interferometer 12. The main control system 20 exchange commands and parameters between the main control system 20 and various control circuits in the stage control unit 14, and executes the optimal exposing processing in accordance with a program designated by an operator. For this purpose, there is provided an operation panel unit (including an input device and a display device) (not shown) forming an interface between an operator and the main control system 20.

Further, when the exposing operation is carried out, it is necessary to previously align a reticle R and a wafer W with each other. The projection exposing apparatus shown in FIG. 1 is provided with a reticle alignment system (RA system, hereinafter) 21 for setting a reticle R to a predetermined position, and an off-axis type alignment system 22 (mark detection system) for detecting a mark on a wafer W. A main body of the alignment system 22 is fixed to the measuring frame 15. A light-sending optical system is fixed to the second support section 16B shown in FIG. 2. The light-sending optical system introduces alignment illumination light of a tip end of the main body to a to-be detected mark, and which introduces light from the to-be detected mark to the main body. The alignment system 22 can be regarded as a sensor which measures the positional relationship between the projection optical system PL, a wafer W, and a to-be detected mark on the measuring stage 29.

As described above, the wafer stage WST and the measuring stage 29 are separated from each other in this embodiment. Therefore, in FIG. 2, when the wafer stage WST is moved in the −Y-direction and wafers are exchanged, the measuring stage 29 is moved below the projection optical system PL, and predetermined reference marks on the measuring stage 29 are successively detected by the RA system 21 and the alignment system 22. With this, a base line amount (distance between the exposure center and detection center of the alignment system 22) can be measured. Thereafter, the measuring stage 29 is retreated in the +Y-direction, and the wafer stage WST is moved below the projection optical system PL. When the wafers are aligned with each other using the alignment system 22, if the base line amount is used, it is possible to align the wafers precisely.

In FIG. 1, when the laser light source 1 is an excimer laser light source, a laser control unit 25 which is controlled by the main control system 20 is provided. The laser control unit 25 controls pulse oscillation modes of the laser light source 1 (one pulse mode, burst mode, standby mode and the like). The laser control unit 25 also controls discharging high voltage of the laser light source 1 for adjusting the average light quantity of emitted pulse laser light. A light quantity control unit 27 controls the variable beam attenuator 4 such that the optimal exposure quantity can be obtained based on a signal from a photoelectric detector 26 (integrator sensor) which photo-receives a portion of illumination light divided by the beam splitter 3. The light quantity control unit 27 sends information of intensity (light quantity) of pulse illumination light to the laser control unit 25 and the main control system 20.

In FIG. 1, at the time of scanning and exposing operations, the irradiation of reticle R with illumination light IL is started and an image of a portion of a pattern of a reticle R obtained through the projection optical system PL is projected on one shot region on a wafer W. In this state, the reticle stage RST and the wafer stage WST are moved in synchronization with each other (synchronized scanning) in the Y-direction at a speed ratio of projection magnification of the projection optical system PL. This movement is called scanning exposing action. With this scanning exposing action, the pattern image of the reticle R is transferred on the shot region. Then the irradiation of illumination light IL is stopped, and the stepping and moving action of a wafer W through the wafer stage WST in the X-direction and Y-direction and the scanning exposing action are repeated. With this, the pattern image of the reticle R is transferred on all of the shot regions on the wafer W by the step and scan method.

Next, the structure of the mechanism portion of the projection exposing apparatus of the embodiment will be explained in detail.

In the mechanism portion shown in FIG. 2, two large and small pedestals 17A and 17B are disposed on a floor surface FL such as to define an installation surface of the projection exposing apparatus. The laser light source 1 and a first illumination system chamber 19A are fixed to the smaller pedestal 17B, and a second illumination system chamber 19B is connected on the first illumination system chamber 19A. As one example, members from the homogenizing optical system 2 to the relay lens system 6 in the illumination optical system 9 shown in FIG. 1 are accommodated in the illumination system chambers 19A and 19B. A moving blind of the reticle blind mechanism 7 is accommodated in an injection end 19C of the illumination system chamber 19B. A mirror which upwardly bends illumination light from the laser light source 1 is accommodated in a lower portion of the first illumination system chamber 19A. Disposition and the number of optical path bending mirrors are different from those shown in FIG. 1.

The wafer base WB is fixed to the large pedestal 17A, and the wafer stage WST and the measuring stage 29 are disposed on the wafer base WB in parallel. A base frame 18 (frame) is disposed on the pedestal 17A such as to surround a wafer base WB. A reticle base 31 is disposed on the base frame 18 through active vibration isolations 30A and 30B (in the real case, the isolations are disposed at three or four locations). The reticle stage RST which holds a reticle R is disposed on the reticle base 31. A third illumination system chamber 19E which accommodates the image forming lens system 8 shown in FIG. 1 is supported on the reticle base 31 through a column 32. A stationary blind of a reticle blind mechanism 7 shown in FIG. 1 is accommodated in an incident end 19D of the third illumination system chamber 19E. A pair of RA systems 21 are disposed on both ends of an optical path of illumination light IL in an opening of a tip end of the column 32 in the X-direction (non-scanning direction). In this case, the projection optical system PL passes through an opening 15a formed in a center of the measuring frame 15 and an opening 18a formed in an upper portion of the base frame 18. A tip end of the projection optical system PL is accommodated in a recess formed in a central portion of a bottom surface of the reticle base 31. An opening for the illumination light IL is formed in the recess.

The projection optical system PL is disposed in a non-contact state with respect to the measuring frame 15 and the base frame 18. As described above, short sensor columns 34A, 34D and 34E (see FIG. 3) to which laser interferometers 12A, 12D and 12E are fixed, and long sensor columns 34B and 34C to which laser interferometers 12B, 19A and 12C and 10B are fixed are fixed to the measuring frame 15. An upper end of the long sensor column 34B passes through an opening 18b of the base frame 18 and an opening 31a of the reticle base 31 in a non-contact state, and projects upward from the reticle base 31. Similarly, the sensor column 34C shown in FIG. 3 also passes through the base frame 18 and the opening of the reticle base 31 in a non-contact state and projects upward from the reticle base 31. A pair of support sections 16A and 16B are fixed to a bottom surface of the measuring frame 15. Portions of the auto-focus sensors (23A, 23B) and the alignment system 22 are mounted on the support sections 16A and 16B.

The measuring frame 15 of this embodiment is hanged down and supported by hanging members (first soft structures) 38A, 38B and 38C (see FIG. 3) at three locations from the bottom surface of the upper portion of the base frame 18 independently from the projection optical system PL. Chains can be used as the hanging members 38A and 38C in this embodiment, but instead of the chains, wires or rods formed with at their upper and lower ends with flexure structures can also be used. A vibration isolation 39A (vibration isolating section) and the like for reducing vibration in the Z-direction which is the direction of the optical axis of the projection optical system PL is provided between the hanging members 38A to 38C and the base frame 18. A first support device supports the measuring frame 15 in the hanging manner includes the base frame 18, the hanging members 38A and 38C, and the vibration isolation 39A. By supporting the measuring frame 15 in the hanging manner using the light-weighted soft structure, independently from the projection optical system PL in this manner, it is possible to reduce influence of vibration on the projection optical system PL from the measuring frame 15 (e.g., vibrator which is one part constituting auto focus), and to support the measuring frame 15 having the various sensors by means of the simple and light-weighted mechanism. According to this structure, there is a fear that the relative positions of the projection optical system PL and the measuring frame 15 is varied, but since the laser interferometers 12A and 10A in the measuring frame 15 measure the relative positions of the wafer stage WST and the reticle stage RST with respect to the projection optical system PL, the wafer stage WST and the reticle stage RST can always control the positions precisely with respect to the projection optical system PL.

In FIG. 2, a flange portion PLb is formed on a side surface of the projection optical system PL. The flange portion PLb is hanged down from and supported by the bottom surface of the upper portion of the base frame 18 at three locations through hanging members (second soft structures) 35A, 35B and 35C (see FIG. 3). The structures of the hanging members 35A to 35C are the same as those of the hanging members 38A and 38C, and a vibration isolation 36A (vibration isolating section) (see FIG. 4) for reducing vibration in the Z-direction is provided between the base frame 18 and the hanging members 35A to 35C. The structures of the vibration isolations 36A and 39A will be explained later. A second support device which supports the projection optical system PL in the hanging manner includes the base frame 18, the hanging members 35A to 35C and the vibration isolation 36A. By supporting the projection optical system PL in the hanging manner using the light-weighted soft structure, it is possible to reduce influence of vibration when the wafer stage WST and the reticle stage RST are driven, and influence of vibration from the floor surface FL on the projection optical system PL. It is also possible to fix the projection optical system PL through the base frame 18 or a member (not shown) having high rigidity.

FIG. 3 is a plan view of the measuring frame 15. As shown in FIG. 3, in this embodiment the hanging members 38A and 38C which support the measuring frame 15 and the hanging members 35A to 35C which support the projection optical system PL are disposed at substantially the same angle positions on the side surface of the projection optical system PL. By aligning phases of the hanging members 38A and 38C and the hanging members 35A to 35C, the assembling operation of the measuring frame 15 and the projection optical system PL into the projection exposing apparatus becomes easy, and the stabilities of the measuring frame 15 and the projection optical system PL are enhanced. It is not always necessary to align the phases of the hanging members 38A and 38C and the hanging members 35A to 35C, and the hanging members 35A to 35C may be disposed at substantially the intermediate positions between the hanging members 38A and 38C for example. The number of the hanging members 38A and 38C (the number of support points of the measuring frame 15) and the number of the hanging members 35A to 35C (the number of support points of the projection optical system PL) are not limited to three, but may be four or more, and the number of the hanging members 38A and 38C and the number of the hanging members 35A to 35C may be different from each other.

With this structure, high vibration isolating performance can be obtained, and the weight of the mechanism portion can largely be reduced, but there is a fear that the relative positions of the projection optical system PL and the base frame 18 are varied with relatively low frequency. Hence, to maintain the relative positions of the projection optical system PL and the base frame 18 in a predetermined state, columns 33A, 33B and 33C (see FIG. 3) extending in the Z-direction are fixed to three locations of the bottom surface of the upper portion of the base frame 18, and a positioning device of six-degrees of freedom of non-contact method is provided between the columns 33A to 33C and the flange portion PLb of the projection optical system PL.

In FIG. 3, arm portions 37A, 37B and 37C extending toward the flange portion PLb are respectively fixed to the columns 33A, 33B and 33C. The arm portions 37A to 37C are disposed around the optical axis AX of the projection optical system PL substantially 120° apart from one another. A first actuator 40A for displacing the flange portion PLb in the Z-direction, and a second actuator 41A for displacing the flange portion PLb in the circumferential direction are disposed between the first arm portion 37A and the flange portion PLb. A voice coil motor can be used as the actuator 40A or 41A, but an EI core type non-contact electromagnet actuator can also be used.

A first two-axes acceleration sensor 39A is provided on the flange portion PLb near the arm portion 37A. The acceleration sensor 39A detects the acceleration in the Z-direction and the circumferential direction of the flange portion PLb. The two-axes acceleration information detected by the acceleration sensor 39A is supplied to a controller 42. The controller 42 drives the two-axes actuators 40A and 41A based on the acceleration information such that the flange portion PLb relatively stands still with respect to the arm portion 37A (also base frame 18 shown in FIG. 2).

In FIG. 3, third and fifth actuators 40B and 40C for displacing the flange portion PLb in the Z-direction, and fourth and sixth actuators 41B and 40C for displacing the flange portion PLb in the circumferential direction are disposed between the second arm portion 37B and the flange portion PLb, and between the third arm portion 37C and the flange portion PLb. Structures of the actuators 40B, 41B and 40C, 41C are the same as those of the actuators 40A and 41A. Second and third two-axes acceleration sensors 39B and 39C for detecting accelerations of the flange portion PLb in the Z-direction and the circumferential direction are provided on the flange portion PLb near the arm portions 37B and 37C. Acceleration information of the acceleration sensors 39B and 39C is also supplied to the controller 42. The controller 42 drives the two-axes actuators 40B, 41B and 40C, 41C based on the acceleration information such that the flange portion PLb relatively stands still with respect to the arm portions 37B and 37C (also base frame 18 shown in FIG. 2).

As the acceleration sensors 39A to 39C as the displacement sensors, it is possible to use a piezoelectric acceleration sensor which detects voltage generated by a piezoelectric element, and a semiconductor acceleration sensor in which logic threshold voltage of a CMOS converter is varied in accordance with magnitude of distortion is utilized. It is possible to provide a non-contact type position sensor for directly measuring a relative position between the flange portion PLb and the arm portions 37A to 37C instead of the acceleration sensors 39A to 39C. As the position sensor, an eddy current displacement sensor, a capacitance type displacement sensor and an optical sensor can be used.

The positioning device of the projection optical system PL (flange portion PLb) comprises the six-axes acceleration sensors 39A to 39C (displacement sensors), the six-axes actuators 40A to 40C and 41A to 41C, and the controller 42. This positioning device maintains, in a constant state, the relative position of the projection optical system PL with respect to the base frame 18 in the X-direction, Y-direction and Z-direction, and the relative rotation angle around the Z-axis, Y-axis and Z-axis. Response frequency of each of the actuators 40A to 40C and 41A to 41C is about 10 Hz, and the projection optical system PL of the embodiment is supported by an active suspension method against the response frequency. Against vibration of frequency greater than the response frequency, the projection optical system PL is supported in the hanging manner by a passive vibration isolation structure.

Although three columns 33A to 33C are used in FIG. 3, four columns may be used.

Next, an example of a structure of the vibration isolation 36A disposed between the hanging member 35A and the base frame 18 will be explained with reference to FIGS. 4 and 5. A structure of the vibration isolation 39A disposed between the hanging member 38A and the base frame 18 is substantially the same as that of the vibration isolation 36A.

Figure 4:
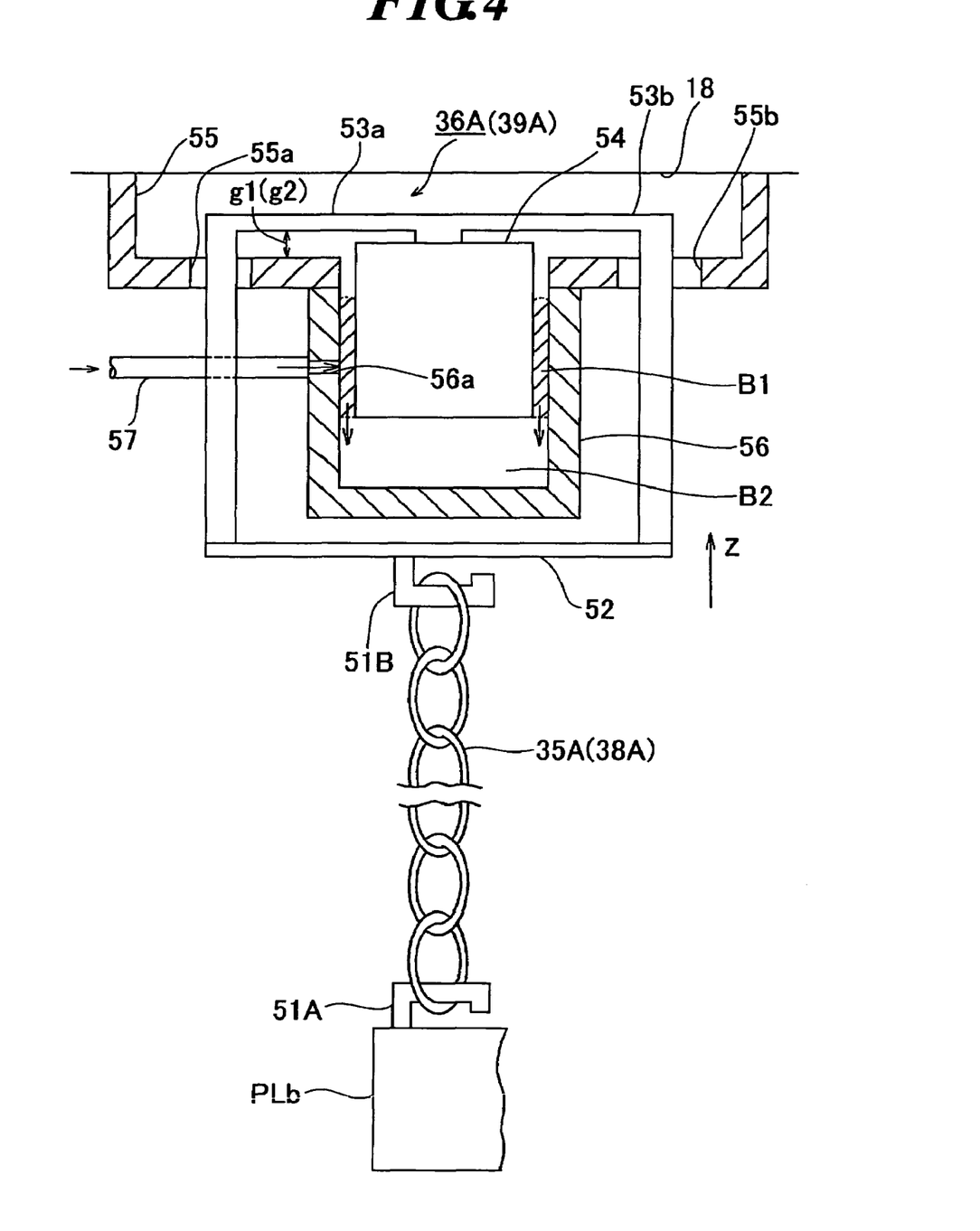
FIG. 4 is a partially cut away enlarged view of an example of structures of a hanging member 35A and a vibration isolation 36A shown in FIG. 2.

FIG. 4 is a partially cut away enlarged view of the hanging member 35A and the vibration isolation 36A. FIG. 5 is a perspective view of the vibration isolation 36A. In FIG. 4, a support member 55 is fixed to the bottom surface of the base frame 18. The support member 55 is formed at its central portion with a circular opening, and at its both ends with spacer portions. A cylinder 52 whose bottom surface is closed is fixed to a bottom surface of the support member 55 such as to cover the circular opening. A cylindrical piston 54 is vertically movably (±Z-direction) disposed in the cylinder 52 with a certain gap therebetween. An upper portion of the piston 54 is connected to a disk-like member 52 disposed below the cylinder 52 through arms 53a, 53b and 53c (see FIG. 5) which are bent downward at three outer sides. The hanging member 35A is connected to a bottom surface of the disk-like member 52 through an L-shaped connection member 51B. The hanging member 35A is connected to the flange portion PLb of the projection optical system PL through a reversed-L shaped connection member 51A. When the hanging member 35A is a chain, processing of a terminal end is extremely easy, and it is easy to adjust its length.

Figure 5:
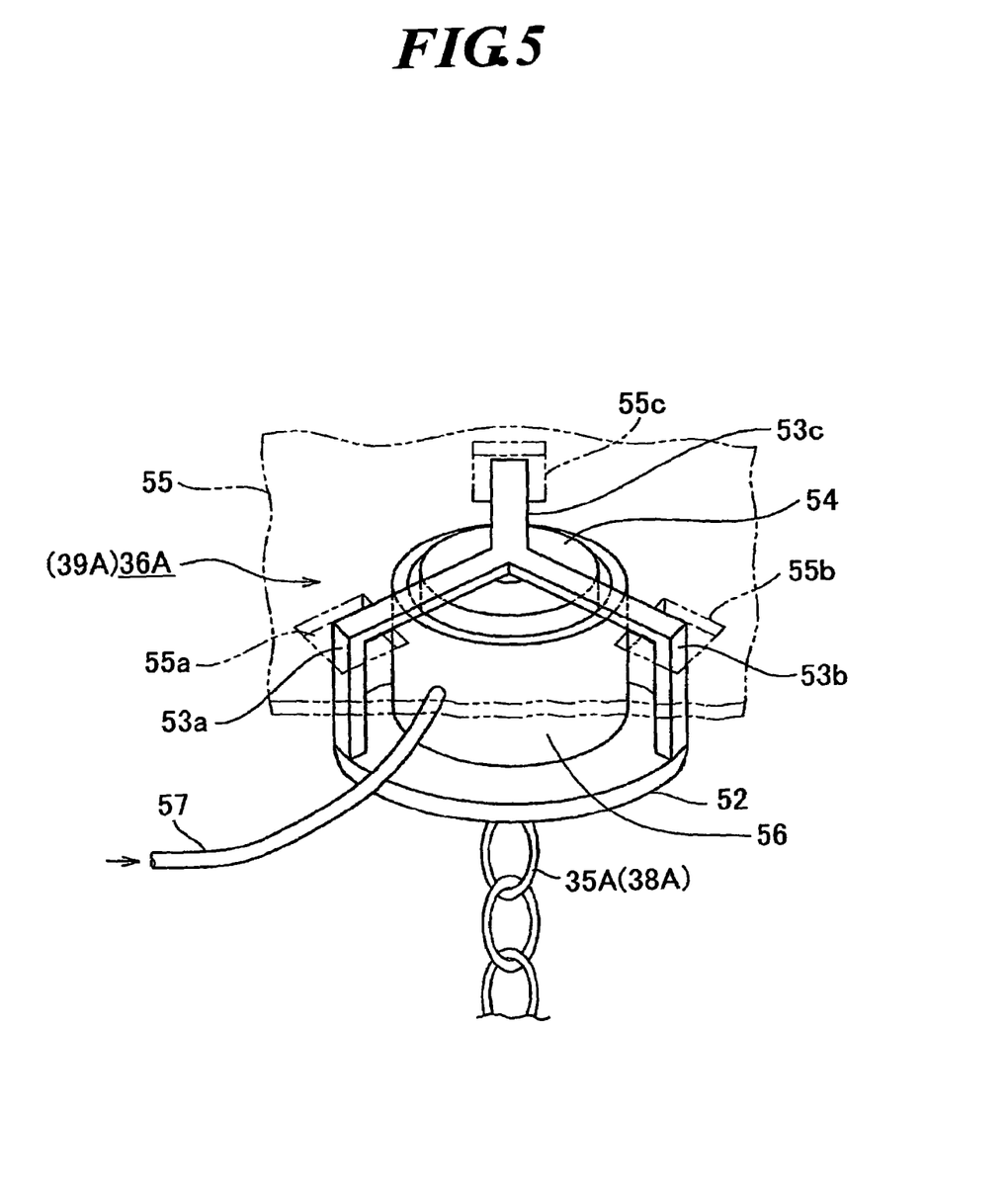
FIG. 5 is a perspective view of the vibration isolation 36A shown in FIG. 4.

In FIG. 5, rectangular openings 55a, 55b and 55c are formed in the support member 55 at three locations such as to surround the central circular opening. The arms 53a to 53c are inserted into the openings 55a to 55c.

Referring back to FIG. 4, an opening 56a is formed in a side surface of the cylinder 56. An external air compressor (not shown) is connected to the opening 56a through an air supply pipe 57, and compressed air from which dust is removed at high level is supplied from the air supply pipe 57 to a space B1 between the cylinder 56 and the piston 54. With this, the cylinder 56 and the piston 54 slide in the Z-direction in a non-contact manner through the air bearing. Since the compressed air flows into a space B2 on the side of a bottom surface of the piston 54 in the cylinder 56, the piston 54 and the hanging member 35A are pushed up (in the +Z-direction) and supported with respect to the cylinder 56 by the compressed air. With this structure, the base frame 18 and the hanging member 35A are connected to each other in a non-contact manner. The vibration isolation 36A includes the support member 55, the cylinder 56, the piston 54, the arms 53a to 53c the disk-like member 52 and the air supply pipe 57.

In this vibration isolation 36A, the compressed air which upwardly passes through the space between the cylinder 56 and the piston 54 is released to a space above the piston 54. This compressed air which released upward can be introduced outside from a side surface of the cylinder 56 through an exhaust pipe (not shown). In this embodiment, a gap g1 between the support member 55 and the arms 53a to 53c is set narrower than a gap between the cylinder 56 and the piston 54, and the pressure of the compressed air supplied from the air supply pipe 57 is controlled such that the gap g1 becomes constant. Therefore, the piston 54, the hanging member 35A and the projection optical system PL shown in FIG. 2 are supported such that they always float up under substantially constant pressure. Thus, even if the base frame 18 vibrates in the Z-direction, this vibration is not transmitted to the hanging member 35A and thus, high vibration isolating performance is obtained also in the vertical direction.

If the pressure of the compressed air supplied from the air supply pipe 57 is reduced, the arms 53a to 53c are placed on the bottom surface of the support member 55, the hanging member 35A and the projection optical system PL are prevented from further lowering.

The vibration isolation 39A disposed between the hanging member 38A (38B and 38C) and the base frame 18 shown in FIG. 3 from which the measuring frame 15 shown in FIG. 2 is hanged down also has substantially the same structure as that of the vibration isolation 36A shown in FIG. 4. In the vibration isolation 39A, however, a gap g2 between the arms 53a to 53c and the support member 55 is set wider than the gap g1 of the vibration isolation 36A (e.g., wider by about 0.5 to 1 mm). As a result, when the exposing step is to be stopped, if the supply of the compressed air to the air supply pipe 57 is stopped, the measuring frame 15 shown in FIG. 2 moves in such a direction that the measuring frame 15 is slightly separated from the projection optical system PL. That is, the vibration isolation 39A may function as a moving mechanism which moves the measuring frame 15 along the optical axis of the projection optical system PL. With this, it is possible to reliably prevent the projection optical system PL and the measuring frame 15 from coming into contact with each other.

An electromagnetic actuator having a displacement amount of about 1 mm can be used as the vibration isolation 39A. As the vibration isolation 36A, it is possible to use the mechanism which utilizes the atmospheric pressure as in this embodiment, a mechanical mechanism using a coil spring, a mechanism which uses a non-contact electromagnetic actuator such as a voice coil motor, and a mechanism having a combination thereof.

In the projection exposing apparatus of the embodiment, as shown in FIGS. 2 and 3, the measuring frame 15 is handed down from and supported by the base frame 18 having the rigidity structure through the hanging members 35A to 35C and 38A to 38C of soft structure in an active suspension manner. The projection optical system PL and the various sensors are mounted on the measuring frame 15. Therefore, the following merits can be obtained.

1) A state in which the projection optical system PL and the measuring frame 15 are assembled and adjusted in a module manner can be maintained after they are assembled. As a result, the precision confirming step after the assembling can be shortened.

2) When the projection optical system PL and/or the measuring frame 15 are exchanged in a producing plant of the exposing apparatus or a producing plant of a semiconductor device, the possibility that the adjusted state of portions other than the projection optical system PL and the measuring frame 15 is changed substantially becomes zero and thus, the adjusting step (returning step) after exchange can be shortened.

3) Since the projection optical system PL and the measuring frame 15 are separated from each other, a reference of measurement and "barrel outside of the projection optical system PL" are put under one umbrella. Therefore, it becomes unnecessary to pay attention to rigidity and thermal expansion characteristics of the measuring frame 15 at the time of designing step, and the measuring frame 15 can be made inexpensive material.

4) Since it becomes unnecessary to support the projection optical system PL by the measuring frame 15, the measuring frame 15 can be reduced in both size and weight. As a result, the freedom of design can be used in an air conditioning system in the exposing apparatus. As a result, there is a merit that the entire exposing apparatus can be reduced in weight, the assembling time can be shortened, and the shipping and transferring operation becomes easy.

Although the laser interferometer on the side of a wafer and the laser interferometer 10 on the side of a reticle are integrally formed and they are fixed to the sensor column 34B in this embodiment, the present invention is not limited to such an embodiment. For example, they may be separated from each other, one of them may be supported by the sensor column 34 and the other one may be supported in another place. In this case, the laser interferometer 10 on the side of the reticle can be disposed on the reticle base 31 instead of on the sensor column 34B.

Figure 6:
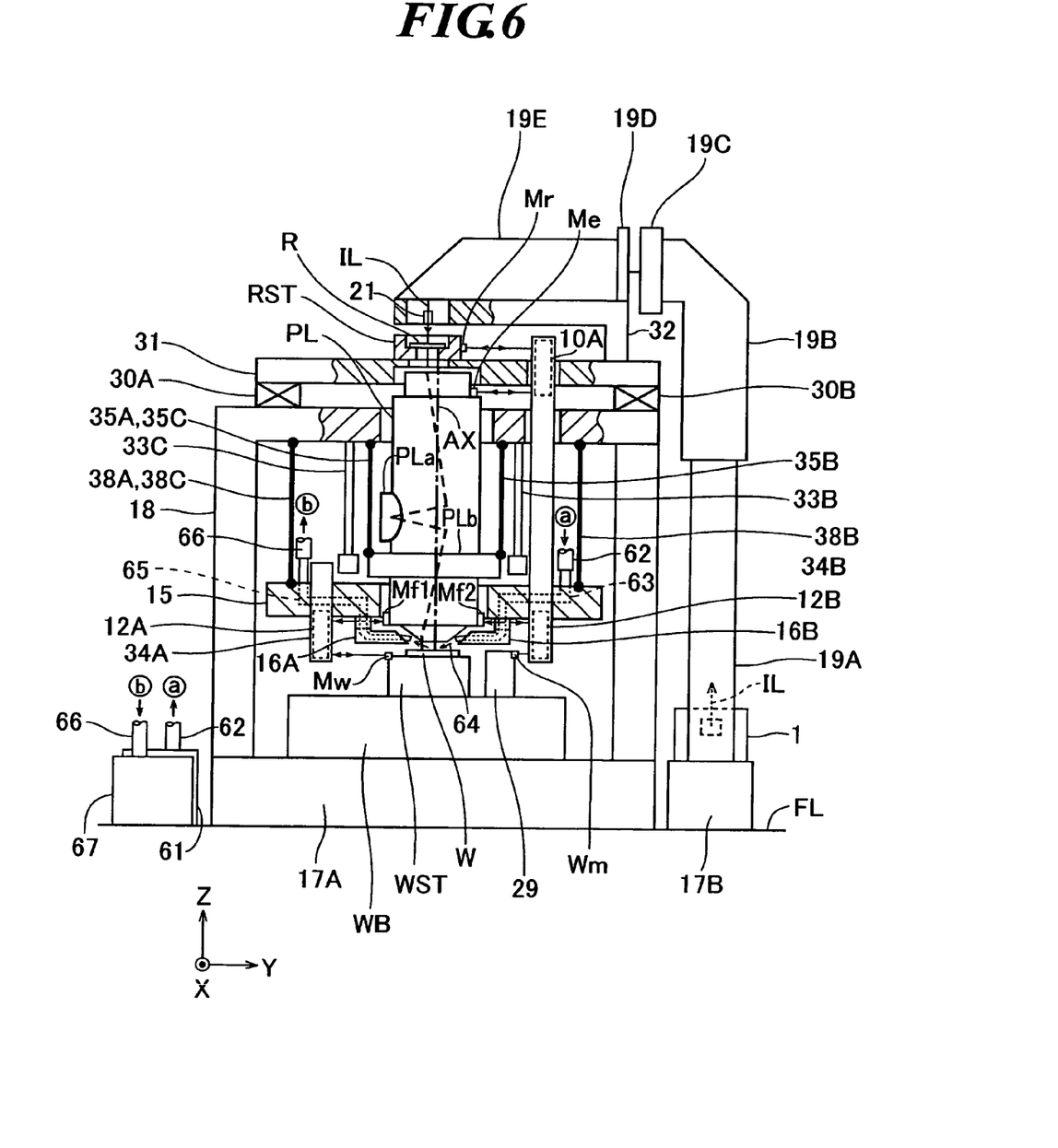
FIG. 6 is a partially cut away schematic diagram showing a structure of a mechanism portion of a projection exposing apparatus according to a second embodiment of the invention.

Next, a second embodiment of the invention will be explained with reference to FIG. 6. A projection exposing apparatus of the embodiment corresponds to the projection exposing apparatus shown in FIG. 2 except that this projection exposing apparatus is of an immersion type. In FIG. 6, elements corresponding to those shown in FIG. 2 are designated with the same symbols, and detailed explanation thereof will be omitted.

FIG. 6 is a schematic diagram of a mechanism portion of the projection exposing apparatus of the embodiment. In FIG. 6, the projection optical system PL is hanged down from and supported by a bottom surface of an upper portion of the base frame 18 through the hanging members 35A to 35C provided at three locations, and the measuring frame 15 is hanged down and supported through the hanging members 38A and 38C of soft structure provided at three locations. Support sections 16A and 16B are fixed to a bottom surface of the measuring frame 15 such that a tip end of the projection optical system PL is sandwiched therebetween in the Y-direction (scanning direction).

A supply section 61 and a recovery section 67 for liquid are disposed on a floor surface FL, liquid 64 such as pure water supplied from the supply section 61 is supplied between the projection optical system PL and a wafer W through a flexible pipe 62 and a metal supply nozzle 63, and an exposing step is carried out in this state. With this, resolution of the projection optical system PL is enhanced, and depth of focus is improved. The supplied liquid 64 is sucked and recovered into the recovery section 67 through a metal recovery nozzle 65 and a flexible pipe 66. A liquid supply device includes the supply section 61, the pipe 62 and the supply nozzle 63. A recovery device for sucking and recovering liquid includes these recovery nozzle 65, pipe 66 and recovery section 67. More concrete structures of the liquid supply device and recovery device are disclosed in a brochure of International Patent Application Publication Laid-open No. 99/49504, and the disclosure thereof is incorporated in this specification by reference.

In this embodiment, the supply nozzle 63 of a portion of the liquid supply device is fixed to a second support section 16B in the +Y-direction, and the recovery nozzle 65 of a portion of the recovery device is fixed to a support section 16A in the −Y-direction. In this structure, since liquid 64 flows in the −Y-direction, the wafer stage WST (wafer W) is scanned also in the −Y-direction. Therefore, in order to scan the wafer stage WST in the +Y-direction and to immerse the wafer stage WST in liquid and expose the wafer stage WST, a supply nozzle (not shown) is fixed also to the support section 16A, and a recovery nozzle (not shown) is fixed also to the second support section 16B. These nozzle portions are also connected to the supply section 61 and the recovery section 67, respectively. Other structures are the same as those of the projection exposing apparatus shown in FIGS. 1 and 2, and sensor columns 34A and 34B in which the laser interferometers 12A and 12B are accommodated are also fixed to the measuring frame 15 shown in FIG. 6.

By fixing the supply nozzle 63 and the recovery nozzle 65 respectively to the measuring frame 15 through the support sections 16B and 16A in this manner, influence of vibration of liquid flowing from the supply section 61 to the recovery section 67 on the projection optical system PL is reduced, and the exposure precision is enhanced.

It is also possible to support the recovery nozzle 65 by a column provided on the base frame 18. It is also possible to support portions of the pipes 62 and 66 by the measuring frame 15.

The projection exposing apparatus of the embodiment can be produced in such a manner that the illumination optical system and the projection optical system comprising a plurality of optical members are assembled into the exposing apparatus main body, optical adjustment is carried out, the reticle stage and the wafer stage comprising a large number of mechanical parts are mounted on the exposing apparatus main body, wiring and piping are adjusted entirely (electric adjustment, checking of operation and the like). It is preferable that the projection exposing apparatus is produced in a clean room where the temperature and the cleaning degree are managed.

A semiconductor device is produced using the projection exposing apparatus of the embodiment through a step for designing function and performance of the device, a step for producing a reticle based on this step, a step for forming a wafer from silicon material, a step for aligning the projection exposing apparatus of the embodiment to transfer a pattern of the reticle on the wafer by means of exposure, a step for forming a circuit pattern such as etching, a step for assembling a device (including a dicing step, a bonding step and a packaging step), an inspecting step and the like.

The present invention can also be applied to a full field exposing type projection exposing apparatus such as a stepper. The invention can also be applied to a projection exposing apparatus which uses a reflection system as the projection optical system, and which uses extreme ultraviolet light (EUV light) having wavelength of some nm to about 100 nm as exposure beam.

The present invention is not limited to application of an exposing apparatus for producing a semiconductor device, and the invention can also widely be applied to a liquid crystal display element formed on a horn glass plate, an exposing apparatus for a display apparatus such as a plasma display, and an exposing apparatus for producing various devices such as an image capturing apparatus (such as CCD), a micromachine, a thin film magnetic head, and a DNA chip. Further, the invention can also be applied to an exposing step (exposing apparatus) when a mask (photomask, reticle and the like) formed with a mask pattern of various devices is produced using a photolithography step.

The invention is not limited to the above-described embodiments, and the invention can variously be modified within a range not departing from the subject matter of the invention.

If the exposing apparatus of the invention is used, it becomes easy to assemble and adjust the exposing apparatus, the vibration isolating performance is enhanced, the exposure precision is enhanced, and various device including fine patterns can inexpensively be produced with high precision.

All disclosure including a specification, claims, drawings and abstract of Japanese Patent Application No. 2005-292186 filed on Oct. 5, 2005, all disclosure including a specification, claims, drawings and abstract of Japanese Patent Application No. 2006-273493 filed on Oct. 4, 2006, and all disclosure including a specification, claims, drawings and abstract of U.S. Provisional Application No. US60/728769 are included in this specification by reference.

What is claimed is:

1. An exposing apparatus which projects an image of a pattern by a projection optical system, comprising
   a measuring unit having a sensor which measures a positional relationship between the projection optical system and a member which is positioned in relation to the projection optical system, and
   a first support device which has a first soft structure and which supports the measuring unit in a hanging manner separately from the projection optical system.

2. The exposing apparatus according to claim 1, further comprising a second support device which has a second soft structure and which supports the projection optical system in a hanging manner.

3. The exposing apparatus according to claim 2, wherein the number of supporting points at which the first support device supports the measuring unit and the number of supporting points at which the second support device supports the projection optical system are the same, and the first and second support devices are disposed on a side face of the projection optical system at substantially the same angle positions.

4. The exposing apparatus according to claim 2, wherein the first and second support devices have wires or chains.

5. The exposing apparatus according to claim 2, wherein the second support devices is provided at a portion thereof with a vibration isolating section which reduces vibration of the projection optical system in an optical axis thereof.

6. The exposing apparatus according to claim 1, further comprising a positioning device which positions the projection optical system in a non-contact manner.

7. The exposing apparatus according to claim 6, wherein the first support device includes a frame which supports the first soft structure, and the positioning device positions the projection optical system with respect to the frame.

8. The exposing apparatus according to claim 7, wherein the positioning device includes
   a displacement sensor which measures displacement information of six-degrees of freedom of the projection optical system with respect to the frame, and
   an actuator of six-degrees of freedom which positions the projection optical system with respect to the frame in a non-contact manner based on a result of measurement of the displacement sensor.

9. The exposing apparatus according to claim 1, wherein the first support device includes a moving mechanism which moves the measuring unit along an optical axis of the projection optical system.

10. The exposing apparatus according to claim 1, further comprising a first stage to hold and move an object onto which the projection optical system projects the image of the pattern, wherein
    the sensor of the measuring unit includes at least one of a first laser interferometer which measures a position of the first stage and a focus position measuring device which measures a position of a surface of the object in an optical axis of the projection optical system.

11. The exposing apparatus according to claim 10, further comprising a second stage to hold and move a mask formed with the pattern, wherein
    the sensor of the measuring unit includes a second laser interferometer which measures a position of the second stage.

12. An exposing method which transfers an image of the pattern onto an object using the exposing apparatus according to claim 1.

13. An exposing apparatus which projects an image of a pattern on an object by a projection optical system, comprising
    a liquid supply device which supplies liquid between the projection optical system and the object, and
    a first support device which has a first soft structure, and which supports at least a portion of the liquid supply device in a hanging manner separately from the projection optical system.

14. The exposing apparatus according to claim 13, further comprising a recovery device which sucks the liquid between the projection optical system and the object, wherein
    at least a portion of the recovery device is supported by the first support device.

15. The exposing apparatus according to claim 13, wherein the first support device supports a sensor which measures a positional relationship between the projection optical system and a member which is positioned in relation to the projection optical system.

16. The exposing apparatus according to claim 13, further comprising a second support device which has a second soft structure and which supports the projection optical system in a hanging manner.

17. The exposing apparatus according to claim 16, wherein the number of supporting points at which the first support device supports the liquid supply device and the number of supporting points at which the second support device supports the projection optical system are the same, the first and second support devices are disposed on a side face of the projection optical system at substantially the same angle positions.

18. The exposing apparatus according to claim 16, wherein the first and second support devices have wires or chains, the second support device is provided at a portion thereof with a vibration isolating section which reduces vibration of the projection optical system in an optical axis thereof.

19. The exposing apparatus according to claim 16, further comprising a positioning device which positions the projection optical system in a non-contact manner.

* * * * *